PHOTOSENSITIVE METAL PLATE
Filed June 9, 1966
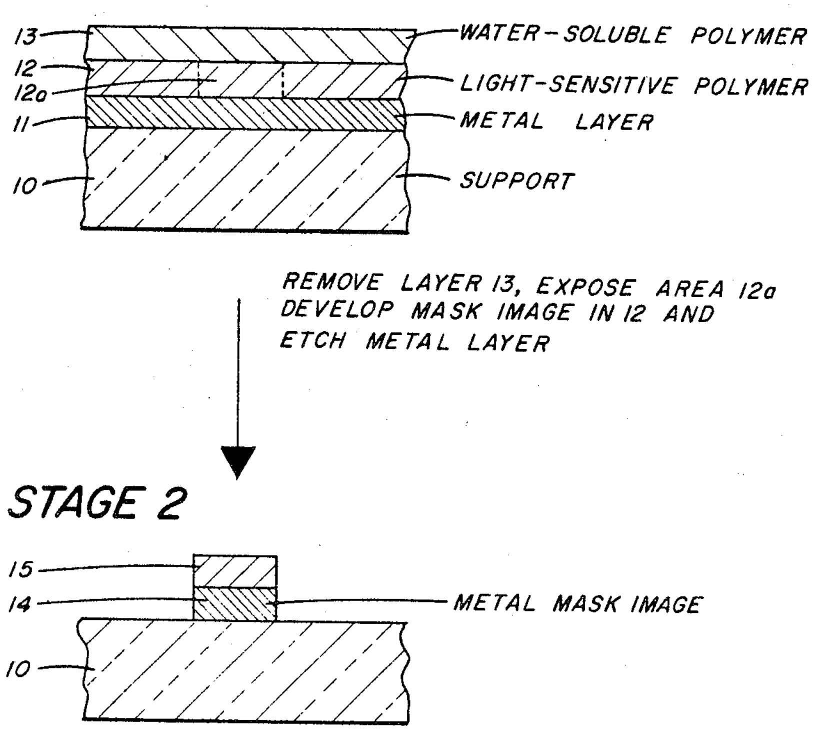
STAGE 1, STAGE 2
HOMER D. LYDICK
ROBERT K. STRONG
ALFRED E. COATES
INVENTORS
BY W. O. [signature]
W. H. McDowell [signature]
ATTORNEY & AGENT United States Patent Office 3,488,194
Patented Jan. 6, 1970

3,488,194

PHOTOSENSITIVE METAL PLATE

Homer D. Lydick, Robert K. Strong, and Alfred E. Coates, Rochester, N.Y., assignors to Eastman Kodak Company, Rochester, N.Y., a corporation of New Jersey Filed June 9, 1966, Ser. No. 556,328
Int. Cl. G03c 1/78
U.S. Cl. 96—67 4 Claims

ABSTRACT OF THE DISCLOSURE

A process for preparing metal mask images or patterns useful for the preparation of integrated circuits, reticles, etc., includes coating a transparent support with a metal layer, a light-sensitive resist layer and a water-soluble polymeric protective layer. Before use, the protective layer is washed off, the resist layer then exposed, developed and a metal mask image etched in the metal layer.

This invention relates to novel and improved light-sensitive photographic elements, and more particularly to novel and improved light-sensitive photographic elements comprising a transparent or translucent support and a metal layer on at least one surface, a light-sensitive layer coated over the metal layer for formation of a resist image and comprising a rubbery material and a cyclic azide type of sensitizer, and preferably also having a protective layer comprising a water-soluble polymer over the photosensitive layer.

It is well-known in the photoresist art to employ rubbery compositions containing various azide such as aryl azide sensitizers as photosensitive coatings on various support materials. Upon exposure to light, the exposed areas become insolubilized, whereas the unexposed areas remain soluble and are removed upon solvent development. A relief image is thereby obtained which may be dyed for use as a copy of the original; it may be used for printing purposes; it may be used as a resist for metal etching purposes, etc. The known capability of photosensitive coatings of the above kind to reproduce extremely fine image detail has tended to make them highly attractive materials in the photoresist art. However, in view of the exactness of the final tolerances required as, for example, in the integrated circuit industry, preparation of the resist coated materials is a slow and laborious operation to insure an adequate coating. In present practice such coatings are made individually by the user as they are required. It would be highly desirable, therefore, to have a ready made product available for immediate use which would include the photosensitive resist layer. Such product would not only eliminate a costly step by the user, but also would maintain a uniformity and reproducibility of work not obtainable heretofore with singly prepared units.

We have now made the important discovery that it is possible to prepare greatly improved, durable light-sensitive photographic elements, which are ready for immediate use for the preparation of metal mask images and patterns, by applying a layer of the aforementioned general kind of photosensitive compositions onto a previously metalized surface of a suitable transparent or translucent support material. Preferably the photosensitive layer is overcoated with a protective layer of a water-soluble polymer which should be removed before the element is put to use. These photosensitive elements of the invention areas characterized by having improved quality and uniformity and being capable of producing superior images as compared with previous materials prepared individually by the user. They are especially useful for the preparation of durable metal negatives and positives which can be contact or projection printed onto suitable light-sensitive silver halide paper or films, data storage units, etched printed circuits reticles, name plates, for decorative purposes, and the like.

It is, accordingly, an object of the invention to provide a novel and improved light-sensitive photographic element comprising a transparent or translucent durable support having a metal layer on a surface on top of which is coated a layer of a photosensitive resist composition comprising a rubbery material and an azide sensitizer therefor. Another object is to provide a novel and improved element of the above kind wherein the said layer of photosensitive resist composition is overcoated with a protective layer comprising a water-soluble polymeric material. Another object is to be provide durable etched metal mask images and patterns. Another object is to provide means for preparing the above materials and products therefrom. Other objects will become apparent from the description and the appended claims.

In accordance with this invention, we prepare our novel and improved light-sensitive photographic elements by first metalizing one surface of a durable transparent or translucent support material which is selected from those not appreciably softened in the organic solvent developer such as glass and synthetic polymeric materials, e.g., polyalkyl methacrylates such as polymethyl methacrylate, polyester film bases such as polyethylene terephthalate, polyvinylacetal, polyamides such as nylon, cellulose ester support materials such as cellulose triacetate, cellulose acetate-propionate and the like. The metal layer is applied to the support material by well-known vacuum deposition techniques. The uniformly metalized surface is then coated with a photosensitive resist coating preferably comprising a rubbery material and a suitable azide compound that is capable of sensitizing the rubbery material. As indicated previously, it is preferable and highly advantageous to overcoat the photosensitive resist layer with a protective layer such as a water-soluble polymer. In this case, the protective layer should be washed off, for example, with water or other aqueous solutions before the element is used. Such protective layer serves to protect the photosensitive resist layer from contamination during manufacture and packaging operations and in subsequent handling until just prior to exposure, thereby ensuring the desired product quality. Both of the mentioned coatings can be carried out by any of the conventional coating procedures such as spraying, roller coating, knife and hopper coating, etc., but preferably by known whirler coating techniques.

The thickness of the various layers in the novel elements of the invention can vary within relatively wide limits and still give operable and satisfactory photoresist elements. Thus, the thickness of the support material, although not critical, can vary about from 0.001 inch to 0.40 inch depending to some extent on the particular support and the intended use. For example, a preferred range for glass ranges about from 0.025 to 0.250 inch. The metal layer can vary about from 100 to 10,000 Angstrom units; the photosensitive resist layer from about 0.1 to 50.0 microns; and the protective layer from about 0.3 to 100.0 microns.

The elements of the invention as described above, although containing relatively thin coatings, are very durable and can be used immediately after preparation or they can be stored for several months or longer, as desired, and then used without appreciable loss of sensitivity or other valuable properties.

Suitable metals than can be used to produce the metalized layers of the invention include chromium, chromium alloys, e.g. Nichrome alloys, steels, etc., and noble metals such as silver, gold, platinum, etc. In some cases, aluminum can also be used. Of these metals, chromium and alloys thereof are the preferred metals.

The rubbery materials that can be advantageously employed in our invention to prepare the photosensitive resist coating compositions include both natural rubber which is commonly known as sulfur-vulcanizable, oxidized rubbers such as described in Stevens et al. U.S. Patent 2,132,809, issued Oct. 11, 1938, cyclized rubbers such as described in Carson U.S. Patent 2,371,736, issued Mar. 20, 1945 and Osterhof U.S. Patent 2,381,180 issued Aug. 7, 1945, rubbery synthetic polymers and copolymers such as those prepared from 1,3-diolefins, e.g. from 1,3-butadiene, isoprene, neoprene, etc., cyclized polyisoprene prepared, for example, as described in J. Polymer Science Pt.A 2(9) pages 3969–85 and 3987–4001 (1964); also copolymers of butadiene with various unsaturated compounds such as styrene, acrylonitrile, isobutylene, etc. Such synthetic copolymers are known commercially under trade names, e.g., Buna S, Buna N, Butyl, Pliolite, and the like. These rubbers, natural and synthetic, are employed in our invention in the form of solutions or dispersions in aromatic rubber solvents, terpenes, esters, ketones, chlorinated hydrocarbons, etc., in concentrations of about from 1 to 40 percent by weight based on the total weight of the photosensitive resist coating composition. The aryl azide sensitizers that are incorporated in the above solutions or dispersions may be present in concentrations of about from 0.05 to 20 percent based on the total weight of the photosensitive polymer present.

Suitable cyclic azide compounds for preparing the photosensitive resist coating compositions of the invention include any of the solvent-soluble aryl azides described in M. Hepher et al., U.S. Patent 2,852,379, issued Sept. 16, 1958, and in J. J. Sagura et al., U.S. Patent 2,940,853, issued June 14, 1960. Particularly efficacious are the 2,6-di(4′-azidobenzal)-4-alkyl cyclohexanones wherein the alkyl group contains from 1 to 4 carbon atoms, e.g., methyl, ethyl, propyl, isopropyl, butyl, etc. Excellent results are obtained with other aryl azides such as 2,6-di-(4′ - benzal)cyclohexanone, 4,4′ - diazidochalcone, 4,4′-diazidostilbene, p-azidobenzophenone, and the like. The above compounds are soluble in common organic solvents including benzene, toluene, xylene, methylene chloride, halogenated hydrocarbons such as trichloroethylene, etc. These are also good solvents for the rubbery materials, especially xylene or trichlorethylene, and are used for preparing the photosensitive resist coating compositions. Solvents such as above further function as solvent developers and for removal of residual resist compositions from the metal layer. Xylene is particularly useful for these purposes.

Water-soluble polymers that are suitable for use in the invention as protective layers must have the following qualities:

(1) Provide a continuous layer of protection for the photosensitive resist layer.

(2) Withstand glass cutting techniques by readily fracturing without losing adherence to the photosensitive resist layer.

(3) Be compatible with and easily coated on top of the photosensitive resist layer.

(4) Be completely and readily removable from the photosensitive resist layer.

(5) Have no effect on the sensitometric properties of the photosensitive resist layer.

Only a limited number of water-soluble polymers meet the above rigid requirements. We have found that the water-soluble solid polyalkylene oxides, e.g. water-soluble solid polyethylene oxides, are outstanding as protective layers in the invention.

The accompanying drawing shows in greatly enlarged cross-sectional view a representative light-sensitive element of the invention and the preparation of a metal mask image therefrom. As shown in stage 1, the element comprises a support 10 such as glass or other of the aforementioned supports, a metal layer 11 such as vacuum deposited chromium or chromium alloy, the photosensitive layer 12, and the water-soluble polymeric protective layer 13. After removal of the layer 13 with water, the element is exposed to an image such as a line negative to insolubilize the exposed areas 12*a* in the photosensitive layer 12, after which the unexposed areas therein are developed with solvent to form a resist image on the metal layer, the bared images of which are then etched with a metal etch solution, for example, an alkaline etching solution such as a sodium hydroxide solution of potassium ferricyanide to produce the element of stage 2. This element comprises the support 10, the metal mask image 14 and the overlying resist image 15, which may be removed.

The following examples further illustrate the invention.

Example 1

A glass plate having a deposition of chromium approximately 2700 Angstrom units thick on one side was thoroughly cleaned by placing it with metal surface side up in tray containing a mild chromium etching solution consisting of 5.5 grams of $K_3Fe(CN)_6$ and 4.0 grams of NaOH in 100 cubic centimeters of distilled water, and capable of etching completely through the layer of chrome in approximately 45 minutes. The plate was left in the tray for 3 minutes during which time the tray was rocked occasionally and the plate surface was gently wiped several times. At the end of 3 minutes, at which time approximately 250 Angstrom units of chromium had been etched away, the plate was removed from the solution, rinsed well in tap water, then in distilled water and finally in an alcohol to remove moisture and rapidly dry the surface. The surface was now ready for coating either immediately or as soon as practical, so long as it was protected from contamination in the meantime.

The above prepared plate was then coated by a whirler coating method with a composition of the following formula:

| | Parts by weight |
|---|---|
| Cyclized polyisoprene | 5 |
| Xylene | 94.5 |
| 4,4′-diazidostilbene | 0.5 |
| Total | 100.0 |

When dry, the above light-sensitive element was exposed through a line negative using as a light source a 500 watt tungsten bulb in a conventional projector at a distance of 8 inches from the lens for a period of 20 seconds. The exposed element was then developed with a spray of xylene for 15–30 seconds, followed by rinsing with butyl acetate for another 15–30 seconds. After drying, the plate was baked at 190° C. for 10 minutes. It was then placed into a solution of potassium ferricyanide made alkaline with sodium hydroxide, until a clear image was obtained. The residual resist material was then thoroughly removed by scrubbing with xylene, to give a metal mask image on glass having extremely fine image detail.

Example 2

The exact procedure of Example 1 was followed except that a protective layer comprising a water-soluble solid polyethylene oxide was coated over the photosensitive resist layer and dried. The coating is facilitated by addition of a spreading agent. This protective coat was removed by rinsing with water, then methyl alcohol, and finally water before exposure of the element. The exposed element was then processed as in Example 1. A similar high fidelity metal mask image was obtained.

By substituting any other of the mentioned cyclic azide compounds into the procedures of the above examples, generally similar high quality metal mask images are obtained. Also, it will be understood that any other of the mentioned natural and synthetic rubber materials can be substituted for the cyclized polyisoprene. The concentrations of the photosensitive resist coating compositions, as well as the thicknesses of the layers produced can likewise be varied. In addition, in the manner of the above examples certain other sensitized light-sensitive polymers which are insolubilized in the regions exposed to light can be coated upon the metal layer and the protective layer coated thereover, and the element used for formation of a negative resist image by removal of the soluble areas of the exposed polymer layer. These additional polymers include vinyl cinnamate polymers, especially (A) polyvinyl cinnamate prepared, and preferably sensitized, as described for example in Minsk et al., U.S. Patents 2,670,286 and 2,690,966, and Robertson et al., U.S. Patent 2,732,301. The thiazole derivative sensitizers of the latter patent are especially useful. These polymers are simply coated from solvent such as methyl glycol acetate onto the metal layer as described above; (B) vinyl cinnamylidene acetate copolymers described in Leubner et al., U.S. patent application Ser. No. 146,742, filed Oct. 23, 1961, now U.S. Patent 3,257,664, e.g. a vinyl cinnamylidene acetate-vinylbenzoate copolymer, and preferably sensitized with compounds such as nitro aromatic compounds, diaminodiphenyl ketones, thiazole derivatives, pyrylium salts, thiapyrylium salts, etc. These copolymers are coated from solvent such as methyl glycol acetate onto the metal layer and the resist image formed thereon as described above.

In the manner of the above examples a positive-working light-sensitive polymer may be coated as layer 12 and the polymer solubilized by the image exposure rather than insolubilized. The protective layer 13 is preferably also coated over layer 12. A representative positive-working polymer is a naphthoquinone-(1,2)-diazide-sulphonic acid ester. Thus our invention contemplates use of both negative- and positive-working light-sensitive polymers to change the solubility of the polymers on exposure to actinic light.

Furthermore, the chromium metal layer can be varied and any other of the mentioned metals can be substituted therefor. For example, chromium gives extremely hard metal mask images, whereas for some applications it might be more desirable to provide a softer metal mask image such as gold. It will be further understood that any other of the mentioned support materials can be substituted in the above examples to provide generally similar ready-made photoresist elements and that metal mask images having extremely fine image detail can also be prepared therefrom.

The invention has been described in considerable detail with particular reference to certain preferred embodiments, but it will be understood that variations and modifications can be effected within the spirit and scope of the invention as described hereinabove, and as defined in the appended claims.

We claim:

1. A light-sensitive photographic element for preparing metal mask images comprising (1) a transparent or translucent support, (2) a metal layer on a surface of said support, (3) a resist layer over said metal layer comprising a light-sensitive solvent-soluble material capable of being insolubilized upon exposure to light and selected from the group consisting of natural rubbers, cyclized natural rubbers, oxidized rubbers, synthetic rubbers, cyclized synthethic rubbers, vinyl cinnamate polymers and vinyl cinnamylidene acetate polymers and (4) a protective layer over said resist layer comprising a solid water-soluble polyalkylene oxide.

2. A light-sensitive photographic element of claim 1 wherein the resist layer contains cyclized polyisoprene.

3. A light-sensitive photographic element of claim 2 wherein the protective layer contains a solid water-soluble polyethylene oxide.

4. A light-sensitive photographic element of claim 2 wherein the metal layer is chromium or a chromium alloy.

References Cited

UNITED STATES PATENTS

| | | | |
|---|---|---|---|
| 2,245,218 | 6/1941 | Murray et al. | 96—50 X |
| 2,257,143 | 9/1941 | Wood | 96—86 X |
| 2,489,662 | 11/1949 | Murray | 96—87 X |
| 2,848,328 | 8/1958 | Hepher | 96—36.3 X |
| 2,852,379 | 9/1958 | Hepher et al. | 96—36.3 X |
| 2,940,853 | 6/1960 | Sagura et al. | 96—36.3 X |
| 3,081,210 | 3/1963 | Wolf et al. | 96—36 X |
| 3,123,492 | 3/1964 | Maffet | 96—87 X |
| 3,143,414 | 8/1964 | Yackel et al. | 96—36 |

OTHER REFERENCES

Huffman, "Photoetching Limited Quantities of Small Metal Parts," Industrial Photography, October 1957, pp. 18–19.

Rose et al., "Condensed Chemical Dictionary," 1961, p. 916

GEORGE F. LESMES, Primary Examiner

R. E. MARTIN, Assistant Examiner

U.S. Cl. X.R.

96—75